(12) United States Patent
Zhuo et al.

(10) Patent No.: US 12,237,841 B2
(45) Date of Patent: Feb. 25, 2025

(54) FREQUENCY SELECTION CIRCUIT

(71) Applicant: SHENZHEN PANGO MICROSYSTEMS CO., LTD, Shenzhen (CN)

(72) Inventors: Chuntan Zhuo, Shenzhen (CN); Yuanjun Liang, Shenzhen (CN)

(73) Assignee: SHENZHEN PANGO MICROSYSTEMS CO., LTD, Shenzhen (CN)

( * ) Notice: Subject to any disclaimer, the term of this patent is extended or adjusted under 35 U.S.C. 154(b) by 0 days.

(21) Appl. No.: 18/253,053

(22) PCT Filed: Mar. 24, 2021

(86) PCT No.: PCT/CN2021/082550
§ 371 (c)(1),
(2) Date: May 16, 2023

(87) PCT Pub. No.: WO2022/126894
PCT Pub. Date: Jun. 23, 2022

(65) Prior Publication Data
US 2023/0421162 A1 Dec. 28, 2023

(30) Foreign Application Priority Data
Dec. 16, 2020 (CN) .......................... 202011487091.8

(51) Int. Cl.
*H03B 5/12* (2006.01)
*H03L 7/085* (2006.01)
*H03L 7/099* (2006.01)

(52) U.S. Cl.
CPC ......... *H03L 7/0992* (2013.01); *H03B 5/1206* (2013.01); *H03B 5/1212* (2013.01);
(Continued)

(58) Field of Classification Search
CPC .. H03B 5/1206; H03B 5/1209; H03B 5/1212; H03B 5/1215; H03B 5/1221;
(Continued)

(56) References Cited

U.S. PATENT DOCUMENTS 5,483,203 A * 1/1996 Rottinghaus ......... H03C 3/0933
331/25
5,506,875 A * 4/1996 Nuckolls ................. H03L 7/107
327/39
(Continued)

FOREIGN PATENT DOCUMENTS

CN 102868399 A 1/2013
CN 108155906 A 6/2018

*Primary Examiner* — Levi Gannon
(74) *Attorney, Agent, or Firm* — JEEN IP LAW, LLC

(57) ABSTRACT

The present invention provides a frequency selective circuit, comprising: a voltage-controlled oscillator for outputting a frequency corresponding to the frequency adjustment window; a frequency divider for dividing the clock frequency output by the voltage-controlled oscillator, and feeding back the resulting low frequency to the frequency selection unit; a frequency selective unit for comparing a reference frequency with the resulting low frequency output by the frequency divider, and providing the frequency adjustment window which is configured based on the frequency search window to the voltage-controlled oscillator; a register group for outputting the frequency search window which is provided to the frequency selective unit. The embodiment of the present invention convert the clock frequency from a high frequency to a low frequency. The low frequency is compared with the reference frequency to ultimately find the corresponding low frequency that has the same frequency as the reference frequency.

4 Claims, 5 Drawing Sheets

(52) U.S. Cl.
CPC ......... *H03B 5/1228* (2013.01); *H03B 5/1243* (2013.01); *H03B 5/1265* (2013.01); *H03L 7/085* (2013.01)

(58) Field of Classification Search
CPC .... H03B 5/1228; H03B 5/124; H03B 5/1243; H03B 5/1246; H03B 5/1265; H03L 7/085; H03L 7/099
See application file for complete search history.

(56) References Cited

U.S. PATENT DOCUMENTS

| | | | | |
|---|---|---|---|---|
| 5,777,499 | A * | 7/1998 | Takaishi | H03L 7/113 327/159 |
| 6,167,103 | A * | 12/2000 | Hardin | H04B 15/04 375/376 |
| 6,404,834 | B1 * | 6/2002 | Hardin | H03L 7/197 375/376 |
| 6,469,583 | B1 * | 10/2002 | Usui | H03L 7/199 331/25 |
| 2010/0172455 | A1 * | 7/2010 | McShea | H03L 7/087 375/362 |
| 2011/0267150 | A1 * | 11/2011 | Fan | H03L 7/099 331/36 R |
| 2015/0077193 | A1 * | 3/2015 | Tsuhara | H03B 5/1215 331/36 C |
| 2017/0093409 | A1 * | 3/2017 | Djahanshahi | H03B 5/04 |
| 2017/0302284 | A1 * | 10/2017 | Petrov | H03K 3/0322 |
| 2017/0307762 | A1 * | 10/2017 | Nakajima | H03L 1/022 |
| 2019/0089302 | A1 * | 3/2019 | Moslehi Bajestan | H03B 5/1268 |

* cited by examiner

FREQUENCY SELECTION CIRCUIT

FIELD OF THE INVENTION

The present invention relates to the field of integrated circuit technology, and more particularly, to a frequency selective circuit.

BACKGROUND OF THE INVENTION

For some protocols, such as the PCIE protocol, dynamic switching is required to support different frequencies, while also meeting certain time limits. However, in the prior art, due to the presence of too many capacitor arrays, the frequency selective circuit requires a long time to search for the appropriate frequency. As a result, when supporting dynamic switching, it takes too long to meet the protocol requirements.

SUMMARY OF THE INVENTION

An object of the present invention is to provide a frequency selective circuit.

In order to achieve the above object, the present invention provides a frequency selective circuit comprising a voltage-controlled oscillator for outputting a frequency corresponding to the frequency adjustment window;
  a frequency divider for dividing the clock frequency output by the voltage-controlled oscillator, and †feeding back the resulting low frequency to the frequency selective unit;
  a frequency selective unit for comparing a reference frequency with the resulting low frequency output by the frequency divider, and providing the frequency adjustment window which is configured based on the frequency search window to the voltage-controlled oscillator;
  a register group for outputting the frequency search window which is provided to the frequency selective unit.

Preferably, the register group comprises a first register for outputting the first frequency search window, and a third register for outputting the second frequency search window.

Preferably, the register group comprises a first register and a second register which are for outputting the third frequency search window, and a third register and a fourth register which are for outputting the fourth frequency search window.

Preferably, the voltage-controlled oscillator is an LC oscillator.

Preferably, the LC oscillator comprises PMOS transistor and NMOS transistor.

Preferably, the frequency divider is a feedback frequency divider.

The beneficial effect of the present invention is to provide a frequency selective circuit, where the clock frequency output by the voltage-controlled oscillator is provided to the frequency divider, so that, the clock frequency is converted from a high frequency to a low frequency. The low frequency is compared with the reference frequency to ultimately find the corresponding low frequency that has the same frequency as the reference frequency.

DETAILED DESCRIPTION OF THE INVENTION

Next, the present invention will be further explained in conjunction with the accompanying drawings and embodiments.

It should be noted that all directional indications (such as up, down, left, right, front, back, inside, outside, top, bottom, etc.) in the embodiments of the present invention are only used to explain the relative positional relationships between the components under a specific posture (as shown in the accompanying drawings). If these specific posture change, the directional indications will also change accordingly.

Figure 1:
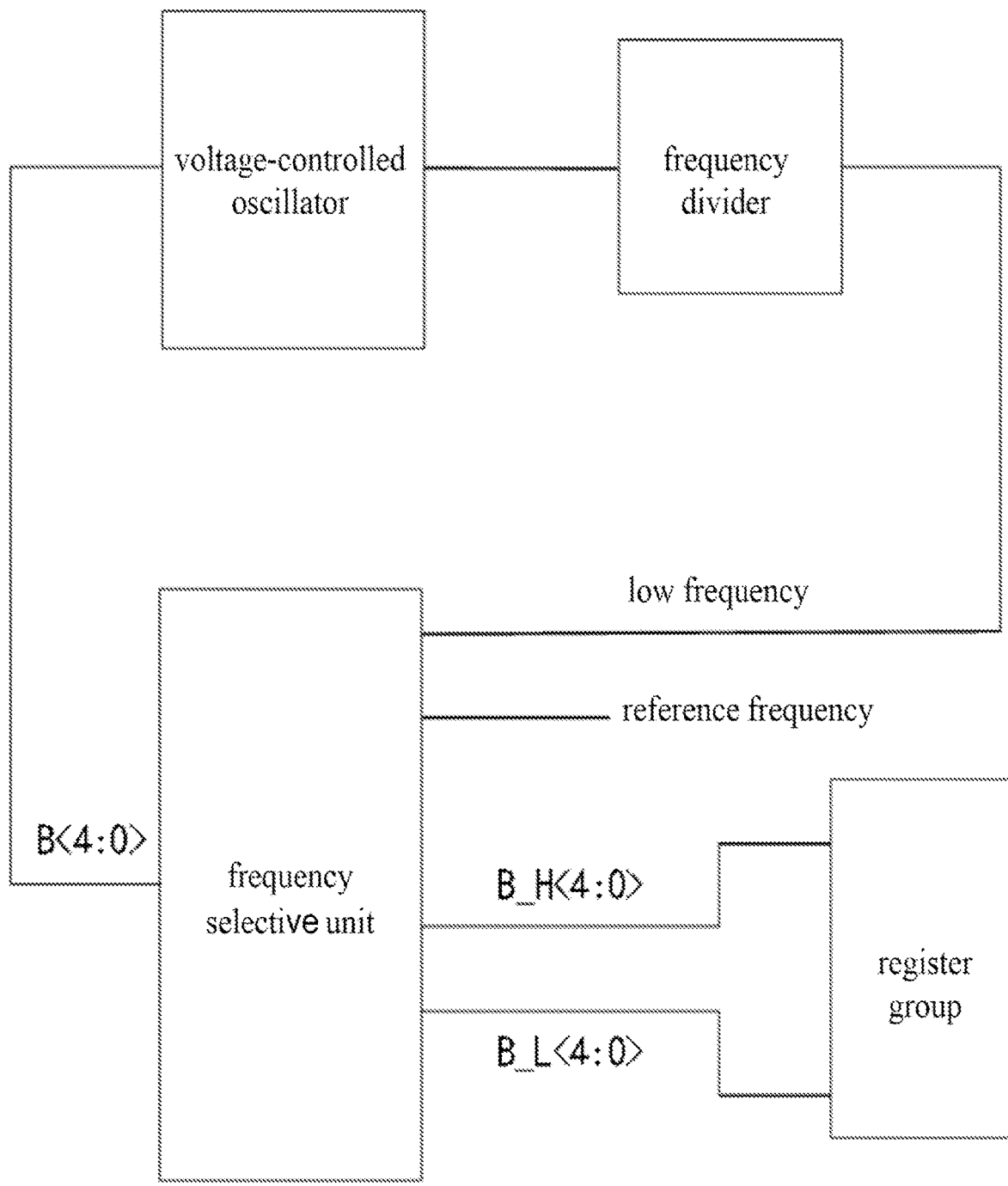
FIG. 1 illustrates the schematic diagram of the frequency selective circuit in one embodiment of the present invention.

As shown in FIG. 1, one embodiment of the present invention provides a frequency selective circuit, comprising a voltage-controlled oscillator, a frequency divider, a frequency selective unit and a register group.

The voltage-controlled oscillator is used to output a frequency corresponding to the frequency adjustment window. The frequency divider is used to divide the clock frequency output by the voltage-controlled oscillator, and to feed back the resulting low frequency to the frequency selective unit. The frequency divider is used to divide the clock frequency output by the voltage-controlled oscillator, and to feed back the resulting low frequency to the frequency selective unit. The frequency selective unit is used to compare a reference frequency with the resulting low frequency output by the frequency divider, and to provide the frequency adjustment window which is configured based on the frequency search window to the voltage-controlled oscillator. The register group is used to output the frequency search window which is provided to the frequency selective unit.

The embodiment of the present invention discloses a frequency selective circuit, where the clock frequency output by the voltage-controlled oscillator is provided to the frequency divider, so that, the clock frequency is converted from a high frequency to a low frequency. The low frequency is compared with the reference frequency to ultimately find the corresponding low frequency that has the same frequency as the reference frequency.

Figure 2:
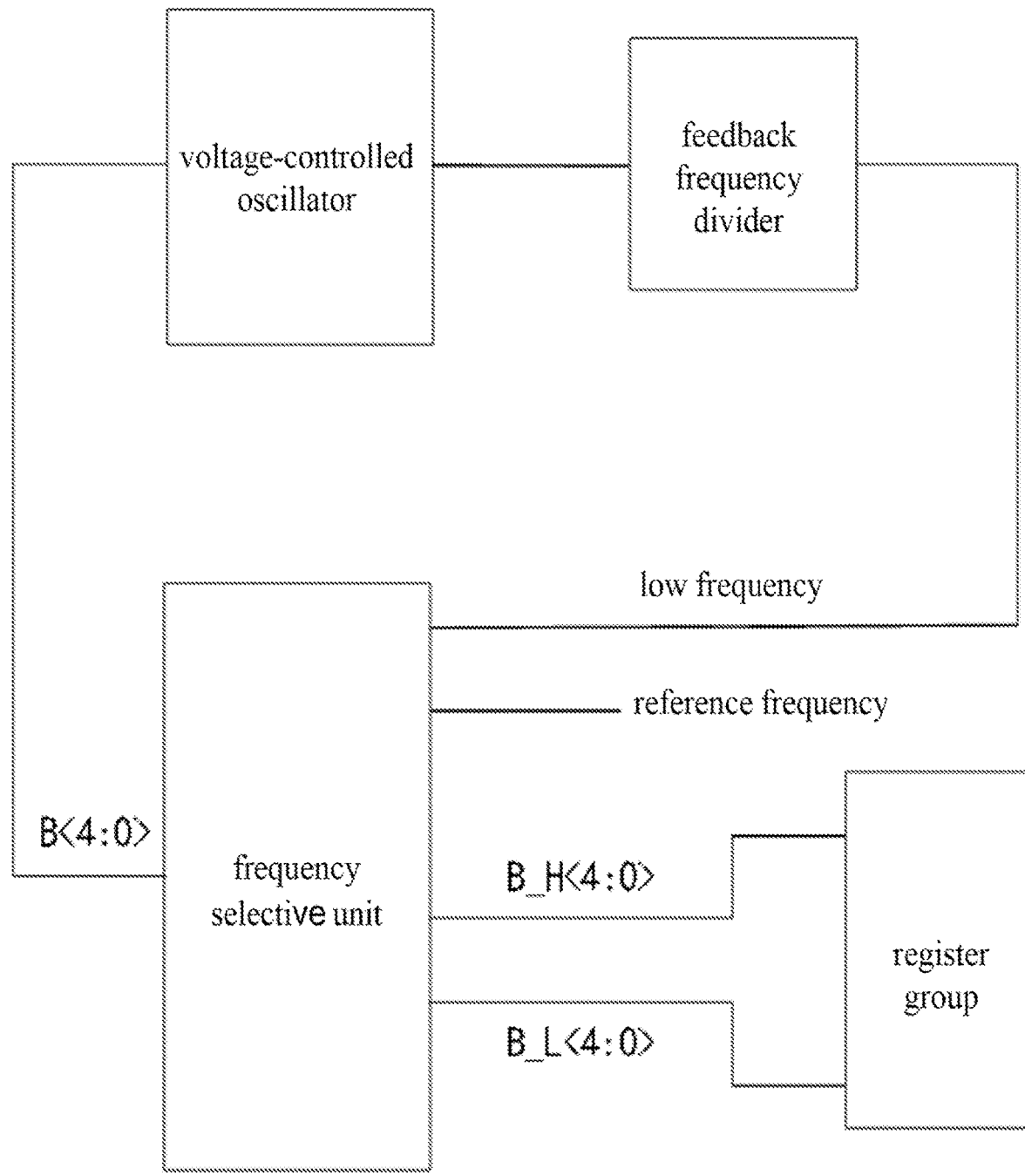
FIG. 2 illustrates the schematic diagram of the frequency selective circuit in another embodiment of the present invention.

Preferably, in another embodiment, as shown in FIG. 2, the frequency selective circuit comprises a voltage-controlled oscillator, a feedback frequency divider, a frequency selective unit and a register group.

The voltage-controlled oscillator is used to output a frequency corresponding to the frequency adjustment window. The feedback frequency divider is used to divide the clock frequency output by the voltage-controlled oscillator, and to feed back the resulting low frequency to the frequency selective unit. The frequency selective unit is used to compare a reference frequency with the resulting low frequency output by the feedback frequency divider, and to provide the frequency adjustment window which is config-ured based on the frequency search window to the voltage-controlled oscillator. The register group is used to output the frequency search window which is provided to the frequency selective unit.

The embodiment of the present invention discloses a frequency selective circuit, where the clock frequency output by the voltage-controlled oscillator is provided to the feedback frequency divider, so that, the clock frequency is converted from a high frequency to a low frequency. The low frequency is compared with the reference frequency to ultimately find the corresponding low frequency that has the same frequency as the reference frequency.

Preferably, in one embodiment, the frequency selective circuit comprises an LC oscillator, a feedback frequency divider, a frequency selective unit and a register group. The register group comprises a first register and a third register, wherein the first register is used to output the first frequency search window, and the third register is used to output the second frequency search window.

The LC oscillator is used to output a frequency corresponding to the frequency adjustment window. The feedback frequency divider is used to divide the clock frequency output by the LC oscillator, and to feed back the resulting low frequency to the frequency selective unit. The frequency selective unit is used to compare a reference frequency with the resulting low frequency output by the feedback frequency divider, and to provide the frequency adjustment window which is configured based on the frequency search window to the LC oscillator. The register group is used to output the frequency search window which is provided to the frequency selective unit.

Figure 3:
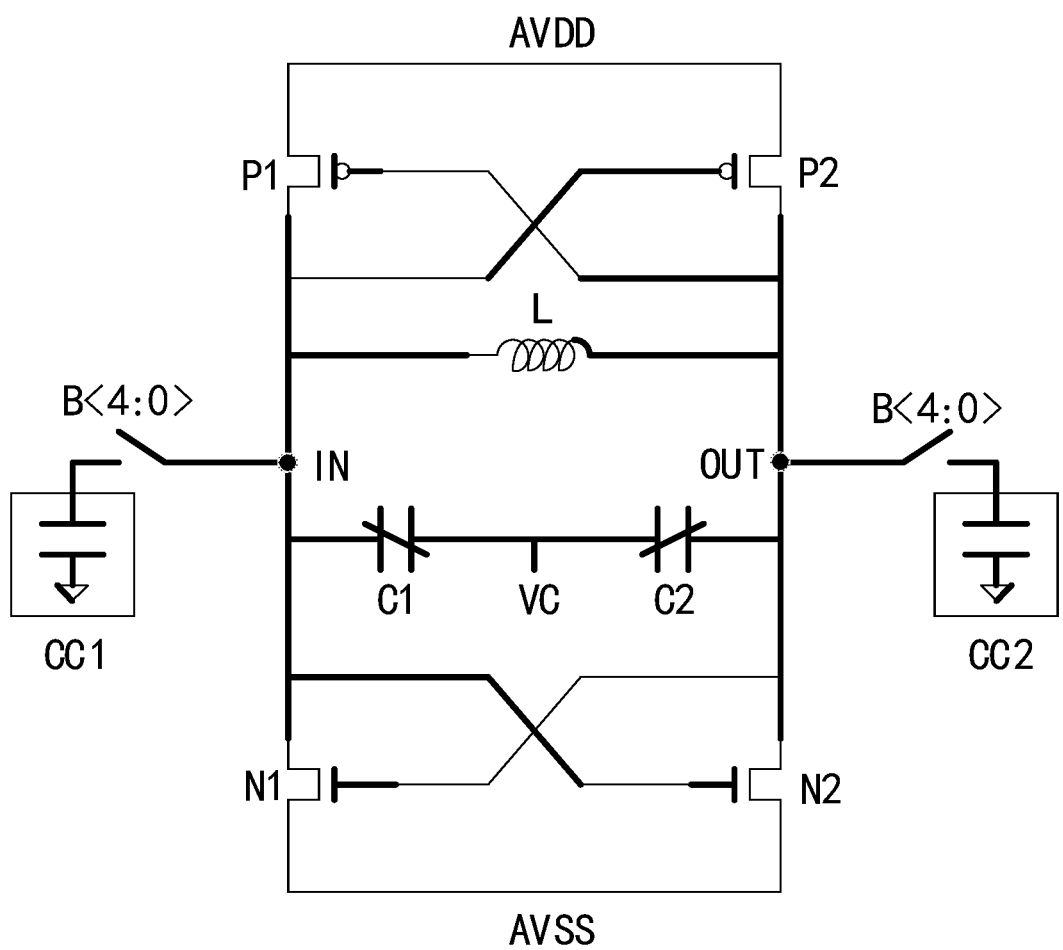
FIG. 3 illustrates the schematic diagram of the LC oscillator in one embodiment of the present invention.

Preferably, the LC oscillator, as shown in FIG. 3, has an input terminal and an output terminal, which includes the first PMOS transistor P1, the second PMOS transistor P2, the first NMOS transistor N1, the second NMOS transistor N2, the first capacitor array CC1, the second capacitor array CC2, the first capacitor C1, the second capacitor C2 and an inductor L. By selecting different capacitor array, such as select the first capacitor array or the second capacitor array, or select the first capacitor array and the second capacitor array at the same time, the LC oscillator can output different frequencies, with lower frequency obtained by using larger capacitors.

The gate of the second PMOS transistor P2, the drain of the first PMOS transistor P1, the gate of the second NMOS transistor N2, the drain of the first NMOS transistor N1, the first end of the first capacitor C1, the first end of the inductor L and the first capacitor array CC1 are connected to the input IN. The gate of the first PMOS transistor P1, the drain of the second PMOS transistor P2, the gate of the first NMOS transistor N1, the drain of the second NMOS transistor N2, the second end of the second capacitor C2, the second end of the inductor L and the second capacitor array CC2 are connected to the output OUT. The source of the first PMOS transistor P1 and the source of the second PMOS transistor P2 are connected to the first power supply AVDD. The source of the first NMOS transistor N1 and the source of the second NMOS transistor N2 are connected to the ground terminal AVSS. The second end of the first capacitor C1 and the first end of the second capacitor C2 are connected to the second power supply VC.

The LC oscillator in one embodiment of the present invention has low jitter performance. The selection of capacitor arrays (the first capacitor array and/or the second capacitor array) can enhance the output frequency coverage, so that the frequency selective circuit can meet application requirement. The on-chip LC oscillator has a high quality factor Q, which results in better jitter performance than a ring oscillator. The duty cycle is closer to 50%, and it can support higher frequencies. The frequency selective circuit satisfies different frequency requirements by selecting the capacitor array.

Figure 4:
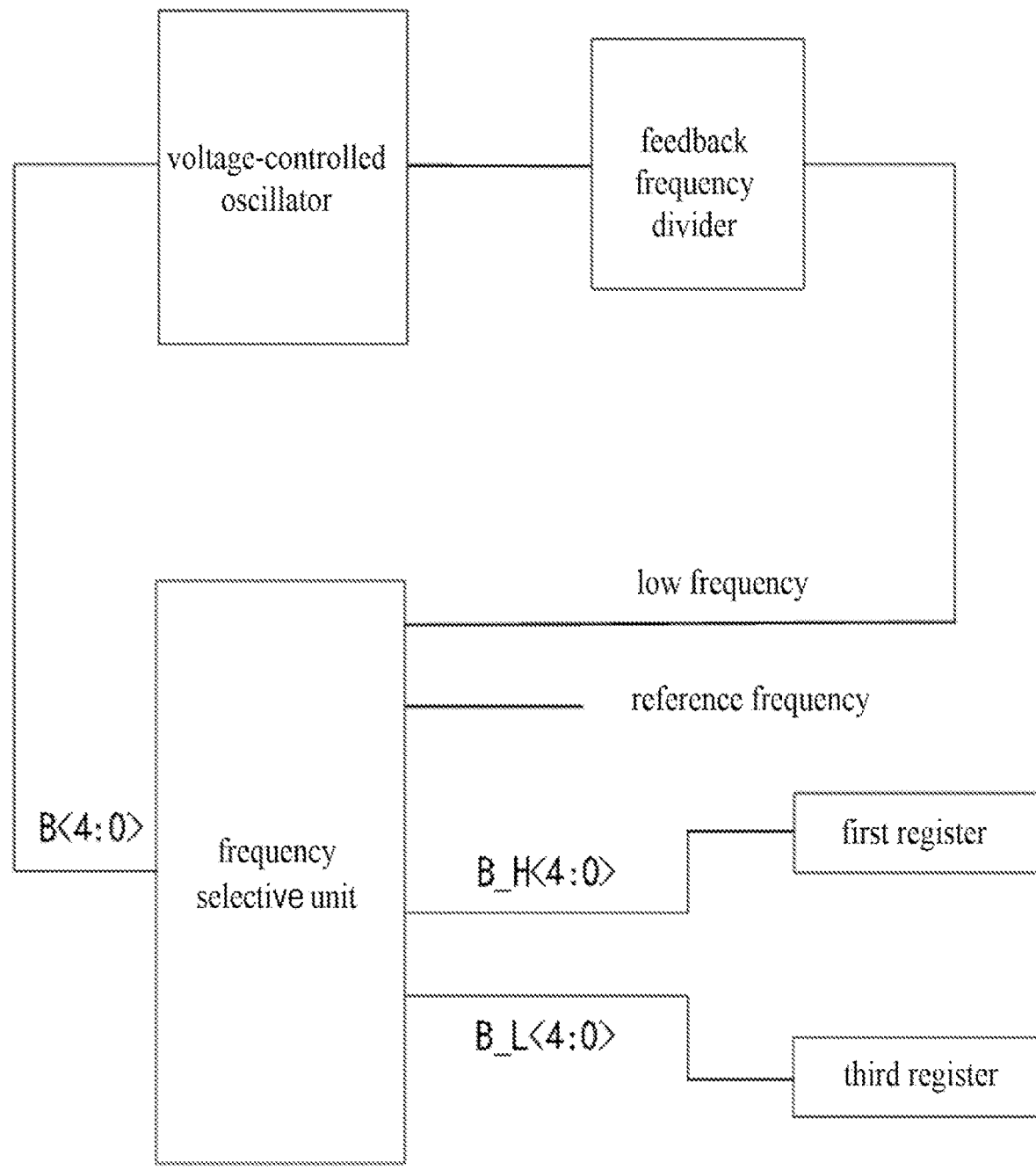
FIG. 4 illustrates the schematic diagram of the frequency selective circuit in yet another embodiment of the present invention.

Preferably, in yet another embodiment, as shown in FIG. 4, the frequency selective circuit comprises a voltage-controlled oscillator, a feedback frequency divider, a frequency selective unit and a register group. The register group comprises a first register and a third register, wherein the first register is used to output the first frequency search window, and the third register is used to output the second frequency search window.

The voltage-controlled oscillator is used to output a frequency corresponding to the frequency adjustment window. The feedback frequency divider is used to divide the clock frequency output by the voltage-controlled oscillator, and to feed back the resulting low frequency to the frequency selective unit. The frequency selective unit is used to compare a reference frequency with the resulting low frequency output by the feedback frequency divider, and to provide the frequency adjustment window which is configured based on the frequency search window to the voltage-controlled oscillator. The register group is used to output the frequency search window which is provided to the frequency selective unit. Wherein, the frequency search window comprises a first frequency search window and a second frequency search window.

The embodiment of the present invention discloses a frequency selective circuit, where the clock frequency is provided to the feedback frequency divider, so that, the clock frequency is converted from a high frequency to a low frequency. The low frequency is compared with the reference frequency to ultimately find the corresponding low frequency that has the same frequency as the reference frequency.

In the frequency selective circuit provided in yet another embodiment of the present invention, the frequency selective unit outputs different frequency search windows B<4:0> based on the output configuration of the register group, so that, the voltage-controlled oscillator outputs different frequency, the frequency selective unit ultimately outputs the frequency that has the same frequency as the reference frequency. The first frequency search window B_H<4:0> and the second frequency search window B_L<4:0> are controlled by two different sets of the first register and the third register, respectively. The maximum search range of the frequency selective circuit is from 5b'00000 to 5b'11111, with 31 steps. The frequency search time of the frequency selective circuit is relatively long. According to different application requirements, the frequency search window can be adjusted at different frequency points to meet the time requirements for dynamic clock switching.

When two frequency points of a high speed transmission protocol are closely adjacent, assume that the first frequency point is at B<4:0>=5b'00001 and the second frequency point is at B<4:0>=5b'00100, the first register can be configured as 5b'00000 and the third register can be configured as 5b'00100. When searching for the first frequency point, the two different sets of the first register which control the first frequency search window B_H<4:0> and the third register which control the second frequency search window B_L<4:0> should be both searched, which would mean a search time of 5 steps, from 5b'00000 to 5b'00100. Similarly, when searching for the second frequency point, the search time would also be 5 steps, from 5b'00000 to 5b'00100. The adjustment of the frequency search window as described above allows for the control of search time when switching between different frequency points, and meets the time requirements for dynamic frequency switching in the protocol.

Figure 5:
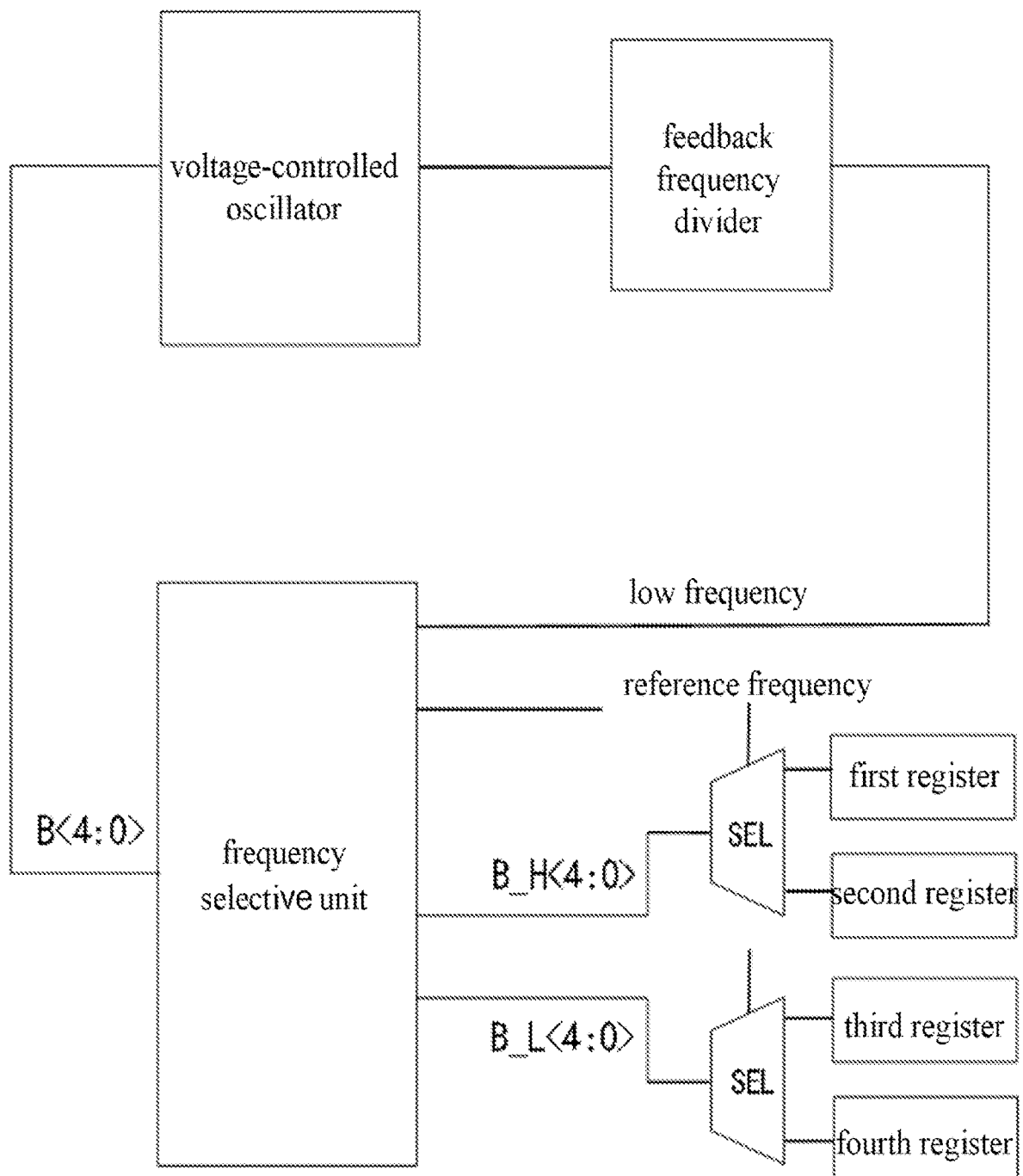
FIG. 5 illustrates the schematic diagram of the frequency selective circuit in still another embodiment of the present invention.

Preferably, in still another embodiment, as shown in FIG. 5, the frequency selective circuit comprises a voltage-controlled oscillator, a feedback frequency divider, a frequency selective unit and a register group. The register group comprises a first register, a second register, a third register and a fourth register. The first register and the third register are used to output the third frequency search window, and the second register and the fourth register are used to output the fourth frequency search window.

The voltage-controlled oscillator is used to output a frequency corresponding to the frequency adjustment window. The feedback frequency divider is used to divide the clock frequency output by the voltage-controlled oscillator, and to feed back the resulting low frequency to the frequency selective unit. The frequency selective unit is used to compare a reference frequency with the resulting low frequency output by the feedback frequency divider, and to provide the frequency adjustment window which is configured based on the frequency search window to the voltage-controlled oscillator. The register group is used to output the frequency search window which is provided to the frequency selective unit. Wherein, the frequency search window comprises the third frequency search window and the fourth frequency search window.

When two frequency points of a high-speed transmission protocol are distantly adjacent, when dynamic configuration switches from one frequency point to another, assuming that the first frequency point is at B<4:0>=5b'00000 and the second frequency point is at B<4:0>=5b'11111, when switching frequencies, the frequency selective circuit needs to search from the third frequency search window B_L<4:0>=5b'00000 to the fourth frequency search window B_H<4:0>=5b'11111, with 31 steps in total. Each search takes a certain amount of time, which can result in a time delay that exceeds the time limit for dynamic protocol frequency switching.

It needs to configure the first, second, third and fourth registers, wherein, the first register and the third register are used to output the third frequency search window and achieve the switch to the first frequency point, the second register and the fourth register are used to output the fourth frequency search window and achieve the switch to the second frequency point.

Assuming that the first frequency point is near B<4:0>=5b'00000, when searching for the first frequency point, it needs to configure the first register=5b'00000 and the third register=5b'00001. Assuming that the second frequency point is near B<4:0>=5b'11111, when searching for the second frequency point, it needs to configure the second register=5b'11110 and the fourth register=5b'11111, and the different registers can be switched by the port switching unit SEL.

When working at the first frequency point, set the port switching unit SEL to 0, and select the first register and the third register. At this time, the frequency selection step of the frequency selective circuit starts to select the frequency from the value of B_H<4:0>, and accumulates to B_H<4:0>. Since the first register and the third register are selected, the frequency selection step is from 5b'00000 to 5b'00001, which means only 2 frequency selection steps are needed to find the first frequency point. When switching from the first frequency point to the second frequency point, the port switching unit SEL changes from 0 to 1, and the register is switched from the first register and the third register to the second register and the fourth register. The second frequency point is near B<4:0>=5b'11111, by searching the second register and the fourth register, select the frequency from 5b'11110 to 5b'11111, it needs 2 frequency selection steps to find the second frequency point.

Compared to using two registers to search for the first frequency point, which requires 31 steps, using four registers only requires 2 steps. Similarly, the search time for the second frequency point is also reduced from 31 steps to 2 steps. When dynamically configuring the protocol to switch from the first frequency point to the second frequency point or vice versa, the required frequency selection time can be greatly reduced, thereby meeting the requirements of the protocol. When the two frequency points of the protocol are far apart, using four registers to reduce the search range from 31 steps to 2 steps greatly reduces the search time, and improves the accuracy and efficiency of frequency point switching in the protocol.

The above embodiments only represent the preferred embodiments of the present invention, and the descriptions are relatively specific and detailed, but should not be construed as limiting the scope of the present invention. It should be noted that those skilled in the art can make improvements without departing from the creative concept of the present invention. All such improvements should be considered within the scope of the present invention.

What is claimed is:

1. A frequency selective circuit comprising a voltage-controlled oscillator for outputting a frequency corresponding to a frequency adjustment window;
   a frequency divider for dividing a clock frequency output by the voltage-controlled oscillator, and feeding back a low frequency obtained by the dividing to a frequency selective unit;
   the frequency selective unit for comparing a reference frequency against the obtained low frequency output by the frequency divider, and providing a frequency adjustment window which is configured based on a frequency search window to the voltage-controlled oscillator; and
   a register group for outputting the frequency search window which is provided to the frequency selective unit;
   wherein the register group comprises a first register, a second register, a third register, and a fourth register, wherein the first register and the third register are used to output a third frequency search window, wherein the third frequency search window comprises at least two frequencies, wherein the frequency selective unit is used to configure the frequency adjustment window as a first frequency for the voltage-controlled oscillator according to the third frequency search window; wherein the second register and the fourth register are used to output a fourth frequency search window, wherein the fourth frequency search window comprises at least two frequencies and is different from the third frequency search window, wherein the frequency selective unit is used to configure the frequency adjustment window as a second frequency for the voltage-controlled oscillator according to the fourth frequency search window;
   wherein the first register and the second register are each connected to and controlled by a first port switching unit, and wherein the third register and the fourth register are each connected to and controlled by a second port switching unit; wherein in response to each of the first and second port switching units changing from a first state to a second state, the first frequency is switched to the second frequency, and wherein frequency selective circuit is operative to switch from the first and the third registers to the second and the fourth registers.

2. The frequency selective circuit of claim 1, wherein the voltage-controlled oscillator is an LC oscillator.

3. The frequency selective circuit of claim 2, wherein the LC oscillator comprises PMOS transistor and NMOS transistor;

the LC oscillator comprises a first PMOS transistor, a second PMOS transistor, a first NMOS transistor, a second NMOS transistor, a first capacitor array, a second capacitor array, a first capacitor, a second capacitor, and an inductor;

a gate of the second PMOS transistor, a drain of the first PMOS transistor, a gate of the second NMOS transistor, a drain of the first NMOS transistor, a first end of the first capacitor, a first end of the inductor, and the first capacitor array are connected to an input of the LC oscillator;

a gate of the first PMOS transistor, a drain of the second PMOS transistor, a gate of the first NMOS transistor, a drain of the second NMOS transistor, a second end of the second capacitor, a second end of the inductor, and the second capacitor array are connected to a output of the LC oscillator;

a source of the first PMOS transistor and a source of the second PMOS transistor are connected to a first power supply;

a source of the first NMOS transistor and a source of the second NMOS transistor are connected to a ground terminal;

a second end of the first capacitor and a first end of the second capacitor are connected to a second power supply.

4. The frequency selective circuit of claim 1, wherein the frequency divider is a feedback frequency divider.

* * * * *